(12) United States Patent
Liu et al.

(10) Patent No.: US 10,710,875 B2
(45) Date of Patent: Jul. 14, 2020

(54) ENCAPSULANT BARRIER

(71) Applicant: Texas Instruments Incorporated, Dallas, TX (US)

(72) Inventors: Jane Qian Liu, Plano, TX (US); Gary Philip Thomson, Rowlett, TX (US); Richard Allen Richter, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 254 days.

(21) Appl. No.: 15/811,562

(22) Filed: Nov. 13, 2017

(65) Prior Publication Data

US 2019/0144270 A1  May 16, 2019

(51) Int. Cl.
*G02B 7/18* (2006.01)
*B81C 1/00* (2006.01)
*B81B 7/00* (2006.01)
*G02B 27/00* (2006.01)
*G02B 26/08* (2006.01)

(52) U.S. Cl.
CPC ........ *B81C 1/00896* (2013.01); *B81B 7/0067* (2013.01); *B81C 1/00317* (2013.01); *G02B 27/0006* (2013.01); *B81B 2201/042* (2013.01); *B81C 2203/019* (2013.01); *G02B 26/0833* (2013.01)

(58) Field of Classification Search
CPC ............ B81C 1/00896; B81C 1/00317; B81C 2203/019; B81B 7/0067; B81B 2201/042; G02B 27/0006; G02B 26/0833
USPC ......................................................... 359/513
See application file for complete search history.

(56) References Cited

U.S. PATENT DOCUMENTS

| | | | |
|---|---|---|---|
| 7,466,018 B2 | 12/2008 | Kocian et al. | |
| 7,491,567 B2 | 2/2009 | DCamp et al. | |
| 7,595,540 B2* | 9/2009 | Fukuda | ................. B81B 7/0077 257/431 |
| 7,768,112 B2 | 8/2010 | Lee et al. | |
| 2007/0018301 A1 | 1/2007 | Fukuda et al. | |
| 2010/0110527 A1 | 5/2010 | Liu et al. | |
| 2016/0225643 A1 | 8/2016 | Fisher et al. | |

OTHER PUBLICATIONS

International Search Report for PCT/US2018/060280 dated Feb. 21, 2019.

* cited by examiner

*Primary Examiner* — Euncha P Cherry
(74) *Attorney, Agent, or Firm* — Michael A. Davis, Jr.; Charles A. Brill; Frank D. Cimino

(57) ABSTRACT

In described examples, a device mounted on a substrate includes an encapsulant. In at least one example, an encapsulant barrier is deposited along a scribe line, along which the substrate is singulatable. To encapsulate one or more terminals of the substrate, an encapsulant is deposited between the encapsulant barrier and an edge of the device parallel to the encapsulant barrier.

20 Claims, 6 Drawing Sheets

ENCAPSULANT BARRIER

BACKGROUND

Electronic circuits are often manufactured as integrated circuits formed by processing silicon wafers. Many such wafers contain individual circuit designs where the individual circuits are cut into dies. The individual dies (chips) are subsequently mounted in manufacturing processes on a single substrate. The substrate is typically separated into separate carriers (or chip packages) by cutting the substrate with a saw or a laser. The substrate is cut along saw lane spaces provided between adjacent mounted dies. However, sawing along the saw lanes (for singulating the mounted dies) can jeopardize the integrity of a mounted die, because of potential contaminants freed by sawing operation. Such constraints have led to increased cost, increased device footprints, and increased thermal management issues.

SUMMARY

In described examples, a device mounted on a substrate includes an encapsulant. In at least one example, an encapsulant barrier is deposited along a scribe line, along which the substrate is singulatable. To encapsulate one or more terminals of the substrate, an encapsulant is deposited between the encapsulant barrier and an edge of the device parallel to the encapsulant barrier.

DETAILED DESCRIPTION

In this description, if a first device couples to a second device, that connection can be made through a direct electrical connection, or through an indirect electrical connection via other devices and connections. Also, in this description: (a) the term "portion" can mean an entire portion or a portion that is less than the entire portion; and (b) the term "encapsulant" can mean a substance that encapsulates and, when cured, supports a portion of a conductor (such as a wire bond or circuit trace affixed to a substrate, which, in turn, supports the encapsulant).

Batch processing techniques are used to manufacture a wide variety of devices. Such devices include microelectromechanical systems (MEMS) devices. The MEMS devices are usually small and often include structures formed at a micron scale. Such structures can be mechanically moving parts, which can be sensitive to heat buildup and contamination. Because of the potential for adverse effects, MEMS devices are often encapsulated to protect against thermal build up and contamination from potential contaminants such as gases, water vapor and particulates. Accordingly, MEMS devices are usually placed on or formed on a substrate such that the placed and/or formed MEMS devices are supported by the substrate and extend above the substrate. The MEMS devices are protected by a sealed enclosure configured to shield MEMS components against potentially adverse environmental conditions and contaminants.

Figure 1:
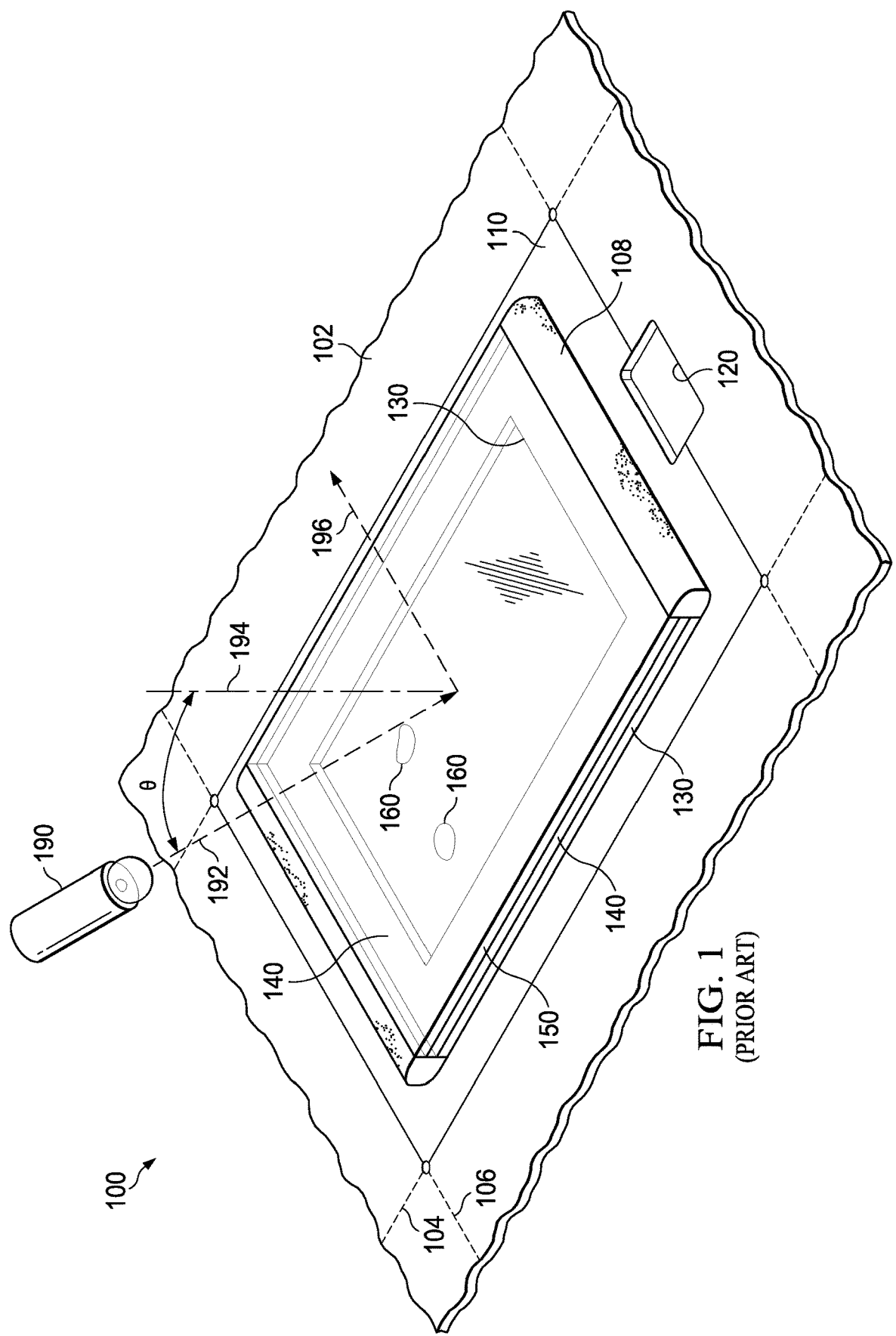
FIG. 1 is an orthographic view of a device mounted on a substrate for batch processing.

FIG. 1 is an orthographic view of a device 130 mounted on a substrate 102 for batch processing. The substrate 102 includes scribe lines 104 and 106. The scribe lines 104 and 106 are areas reserved for severing portions of the substrate 102 into individual portions. A first set of scribe lines (e.g., 104) has a first orientation relative to an axis of a device mounted on the substrate, whereas a second set of scribe lines (e.g., 106) has a second orientation at an angle (e.g., orthogonal) to the first orientation. Before severing the substrate 102 into an individual portion 110, the substrate 102 is usually batch processed to form multiple devices on various portions of the substrate 102.

For example, a first scribe line can be sawn or lased to sever the substrate 102 along a first edge of the mounted device. A second scribe line perpendicular to the first scribe line can be sawn or lased to sever the substrate 102 along a second edge of the mounted device. An individual portion 110 is formed by severing the substrate 102 along the first and second scribe lines. The through-hole 120 usually straddles the scribe line, such that an alignment slot is formed on a respective opposing edge of individual portions 110 when the substrate 102 is severed along the first and second scribe lines.

Device 130 can be a MEMS device (such as a mirrored array), and is mounted in the area 110, which is defined by first and second scribe lines. To reduce size and cost, the first and second scribe lines 104 and 106 are situated as closely as practicable to features of the device 130, in order to minimize any unused area (e.g., described hereinbelow with reference to FIG. 2). The device 130 can include one or more microelectromechanical structures, which are sealed for protection against potential environmental contaminants.

The device 130 is sealed by mounting a spacer 140 and a cover (such as window 150) on the device 130. The spacer 140 and the window 150 are usually mounted by dispensing an adhesive to adjacent contacting surfaces, which secures the spacer 140 and the window 150 and impedes the intrusion of potential contaminants into a cavity that is formed by the arrangement of the device 130, the spacer 140 and the window 150.

An encapsulant 108 (e.g., glob top) is dispensed along an edge of the stack, which is formed by components such as the device 130, the spacer 140 and the window 150. The encapsulant 108 is hardened by a curing process, including one or more of UV irradiation, baking and chemical catalysts and reactions. The cured encapsulant 108 is usually hard and brittle. The cured encapsulant 108 can protect bonding wires (shown in FIG. 2) from mechanical or environmental stress, seal a seam formed by adjacent surfaces of the stack components, conduct heat from the stack components, and block light against escaping from a side edge of the stack.

In at least one example, the device 130 is shown as including a digital micromirror device (DMD), which includes a digitally reconfigurable mirror array covered by a window 150. The device 130 can be an optical device, which dissipates heat when operating as a reflector of a light beam 192 that is projected by a light source 190 for projection (e.g., because the window 150 is less than 100 percent transmissive). The light beam 192 projects through the window 150 at an angle θ relative to the normal axis 194 to be reflected for projection from individual mirrors of the mirror array. When the beam 192 reflects from the individual mirrors, some light 196 is reflected, such that light is transmitted through a side edge of the component stack (instead of being transmitted through the top surface of the window 150). The light 196 can escape environmentally and degrade a characteristic (such as contrast ratio) of an image projected in response to the beam 192. The disposition of the encapsulant 108 can block substantial amounts of light 196, which would otherwise be noticeable by the human eye.

Usually, a set-back space exists between an edge of a bead of encapsulant 108 and a scribe line such as 104 and 106. The set-back space provides a buffer area, because the process of severing the encapsulant 108 during singulation can generate and/or release contamination particles 160. When the contamination particles 160 fall on (and/or adhere to) the window 150, the transmissivity of the window 150 is decreased. When the transmissivity of the window 150 is decreased, more heat is generated, and the potential brightness of the image projected is lessened. The excess heat buildup in turn limits the brightness of the beam 192 for projecting an image. The presence of the contamination particles 160 can also decrease production yields of those singulated units.

Figure 2A:
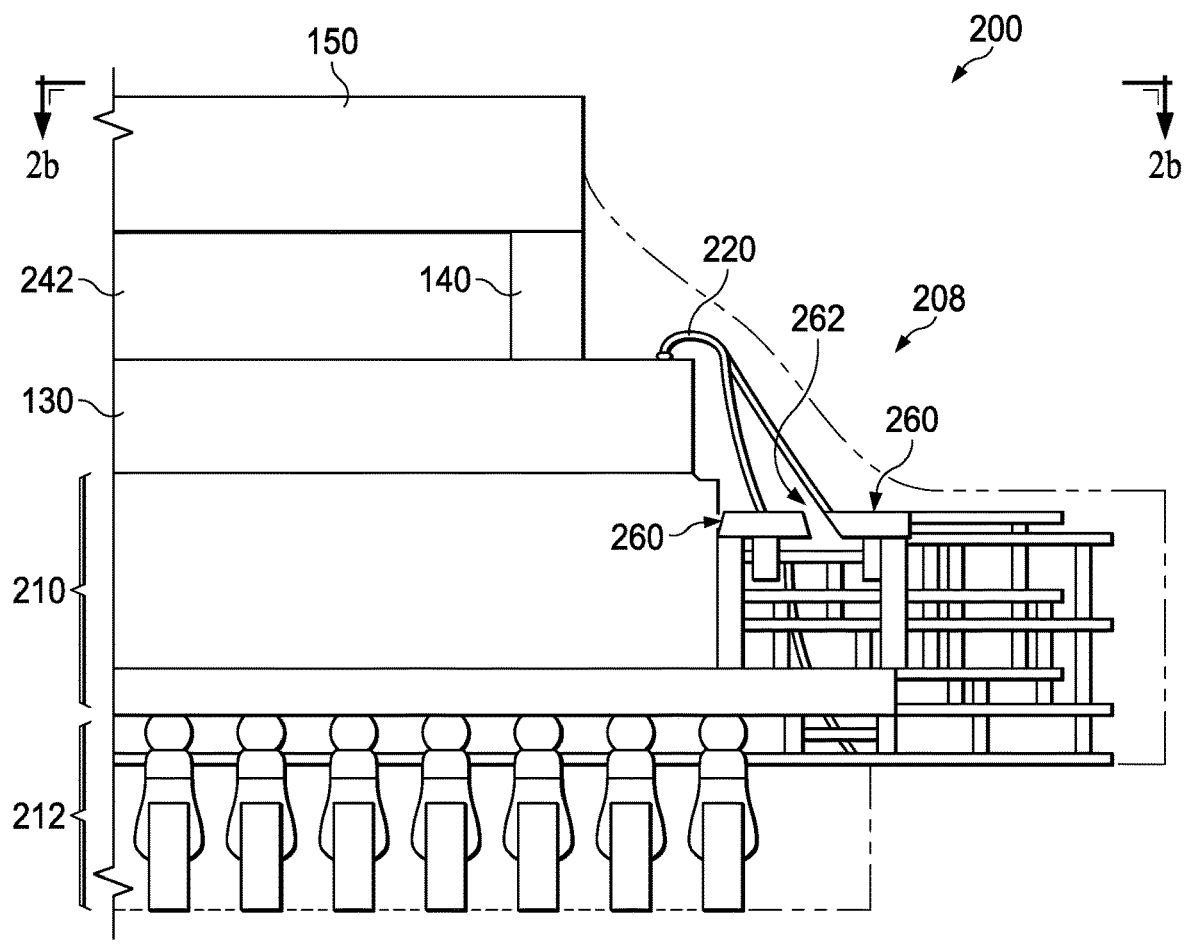
FIG. 2a is a section view of a side-encapsulated assembly, including encapsulated bonding wires coupled to bonding pads formed in a well of a substrate.

FIG. 2a is a section view of a side-encapsulated assembly, including encapsulated bonding wires coupled to bonding pads formed in a well of a substrate. The device 200 includes a component stack, which includes the device 130, the spacer 140 and the window 150. A cavity 242 is formed between an upper portion of the device 130, the inside edges of the spacer 140, and a lower portion of the window 150. The component stack is supported by a substrate 210, under which (and/or including subjacent to) terminals 212 (e.g., leads or pins) are mounted.

The device 130 is coupled to one or more of the terminals 212 by bonding wires 220 attached to bonding pads 260. The bonding pads are formed in a bonding pad well 262 and are electrically coupled to the terminals 212 via conductive channels formed in the substrate 210. The bonding wires are encapsulated by encapsulant 208. In at least one example, the phrase "formed in the substrate" can mean being formed such that the formed structure is supported by the substrate, and a portion of the formed structure is formed at a height level with at least one exposed surface of the substrate.

The encapsulant 208 is dispensed in the bonding pad well, such that the encapsulant 208 forms a generally diagonal slope when viewed in cross-section. The slope of the encapsulant profile can be any convenient profile, such as convex, diagonal or concave. The encapsulant 208 is dispensed in the bonding pad well 262, such that an outer wall of the bonding pad well 262 forms a dam for limiting an outwards migration of the encapsulant 208 (while the encapsulant 208 is still viscous before curing). The outer wall is located on a side of the bonding pad well 262 away from the device 130. By limiting the outwards migration of the encapsulant 208, less area is reserved for a scribe line (e.g., because the encapsulant 208 is dammed against flowing into the scribe area).

The encapsulant 208 is dispensed to form an exposed surface that extends upwards from the top surface of the substrate 110, and inwards towards a side edge (e.g., other than the top surface) of the window 150. An elevation describes the extent of coverage of the side surface of the window 150 by the encapsulant 208, where the elevation can be expressed as a percentage, a fraction or an absolute distance. Accordingly, the bonding pads 260, the bonding wires 220 and the side edges of the device 130 and spacer 140 are covered by the encapsulant 208 after curing, such that heat from the component stack during operation is transferred to the substrate 110 via the encapsulant 208. Further, the encapsulant 208 blocks light against escaping from the covered portion of the window 150, the spacer 140, the device 130 and spaces therebetween (such as a space occupied by an adhesive).

The uncured encapsulant embodies fluid dynamic characteristics, such as viscosity and thixotropy. In contrast, the cured encapsulant embodies solid material characteristics, such as brittleness. For example, the cured (e.g., hardened) encapsulant 208 is brittle such that, when subjected to stress, the cured encapsulant 208 breaks into pieces without significant plastic deformation. Accordingly, during a singulation process, sawing the cured encapsulant results in relatively large amounts of potentially contaminating particles that are broken off and freed from the remaining portions of the encapsulant 208.

Figure 2B:
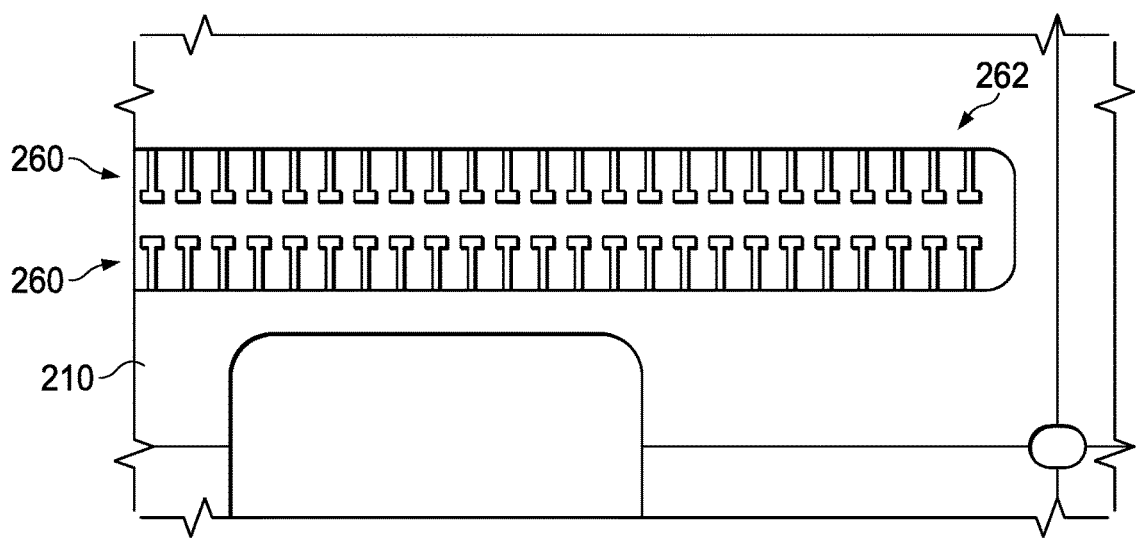
FIG. 2b is a top view of bonding pads formed in a well of a substrate.

FIG. 2b is a top view of bonding pads formed in a well of a substrate. The substrate 110 is patterned and etched to form a bond finger well 262 in the substrate. The bond finger well 262 is a recessed area including a floor and sidewalls that extend below the top surface of the substrate 110. The bond pads 260 are a set of metal terminals formed by patterning and deposition processes on the floor of the bond finger well 262. The bond finger well 262 is usually filled by the encapsulant 208 after bonding wires have been bonded to a respective bond pad 260.

Figure 3:
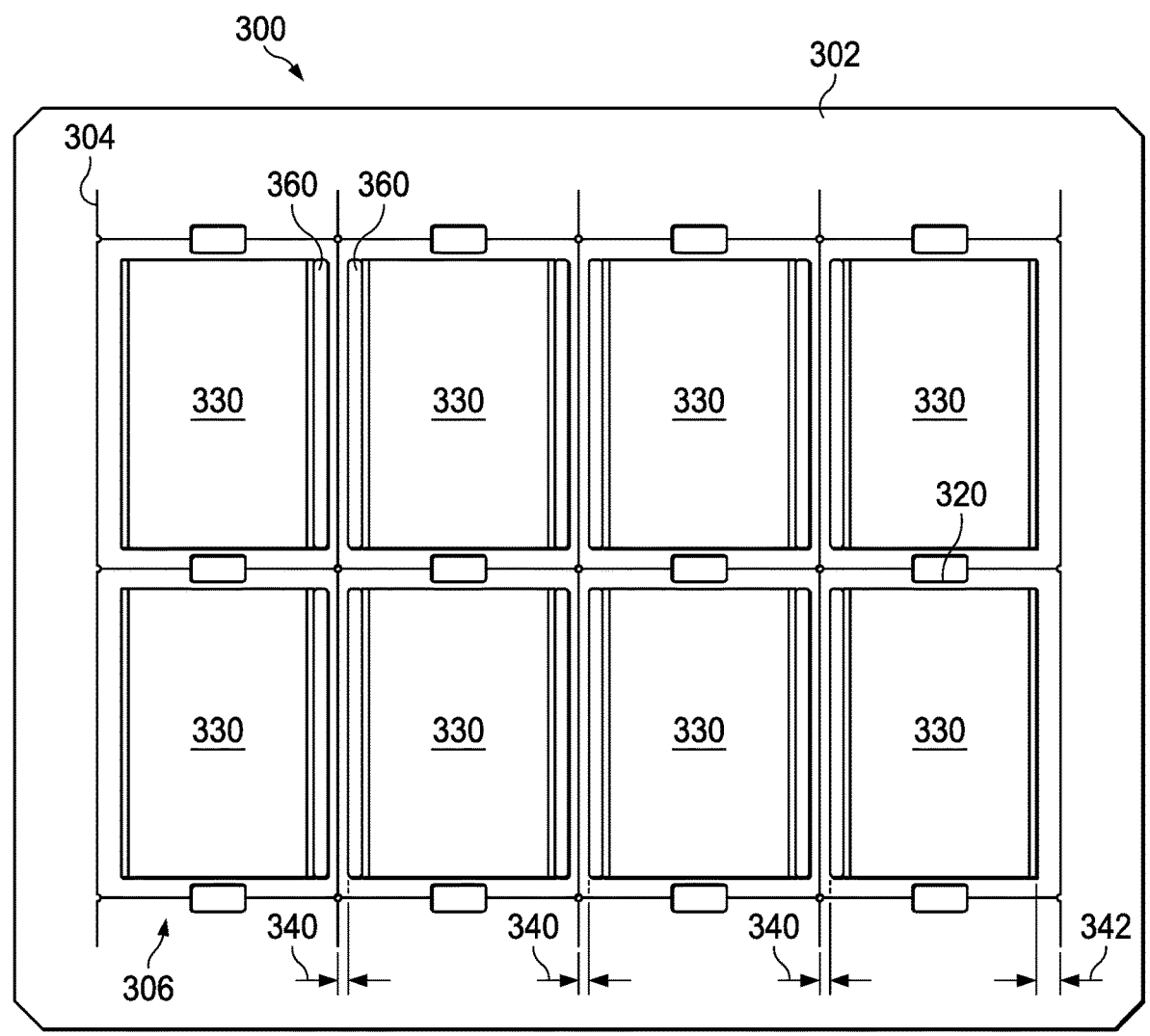
FIG. 3 is a top view of a layout of a substrate, including devices mounted on the substrate in accordance with example embodiments.

FIG. 3 is a top view of a layout of a substrate, including devices mounted on the substrate in accordance with example embodiments. In the production of semiconductors, and particularly in the production of devices 330 such as microelectromechanical system (MEMS) devices, each device 330 is produced initially as many devices arranged in rows and columns (e.g., in a two-dimensional array) as a populated substrate 300 assembly. The substrate 302 is usually ceramic and includes conductors and vias for routing electrical signals and power from a top surface of the substrate 300 to a second surface of the substrate 300. Such arrangements decrease costs, because many devices 330 can be packaged by simultaneously applying process steps. In at least one example, a package is a substrate or a sealed container, which can include die, wafers and/or micromechanical devices in a local environment that is sealed from an outside environment.

For example, each device 330 is arranged in first-orientation arrays (e.g., rows), with at least one set of bond pads 360 interposed between adjacent pairs of devices 330 arranged in the first orientation. A first-orientation scribe line 306 and at least one set of bond pads 360 are arranged between adjacent pairs of devices 330, and adjacent to one or more sets of bond pads 360. The first-orientation scribe line 306 is usually parallel to a long axis (not shown) of an adjacent set of bond pads 360.

A scribe line is a lineal area reserved for singulating the substrate 302 and, accordingly, is not necessarily scribed (for example, a scribe line can be a saw lane). The substrate is singulated along a scribe line that has either a first orientation (i.e., a first-orientation scribe line) or a second orientation (i.e., a second-orientation scribe line).

The first-orientation scribe line 306 is offset by a set-back distance 340 from distal (e.g., outer) ends of the bond pads of the adjacent set of bond pads 360. As described herein, the set-back distance 340 reserves an area for depositing a soft encapsulant on the first-orientation scribe line for reducing the kinds and amounts of potential contaminants generated during singulation, and for captivating any potential contaminants generated during singulation. An end first-orientation scribe line is arranged between an end device 330 (arranged in the first orientation) and an edge of the substrate 302 in accordance with an offset 342.

Also, each device 330 is arranged in second-orientation arrays (e.g., columns), where the second orientation is orthogonal to the first orientation. A second-orientation scribe line 306 is arranged between adjacent pairs of devices 330 arranged in the second orientation. The second-orientation scribe line 306 usually intersects an area reserved for a generally rectilinear through-hole 320 alignment slot. The second-orientation scribe line 306 is offset by a set-back distance from edges of pairs of devices 330 interposed by the second-orientation scribe line 360.

Figure 4:
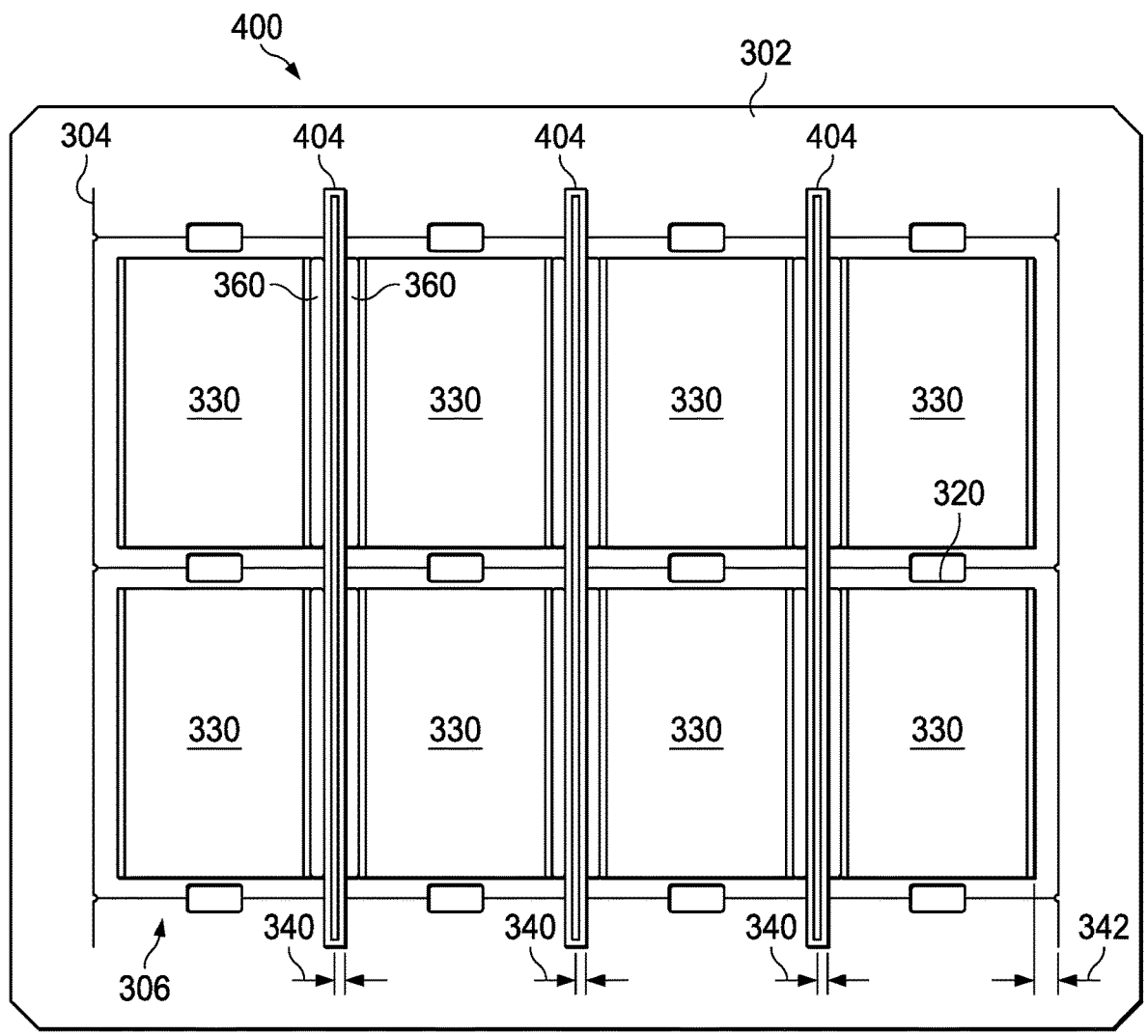
FIG. 4 is a top view of a layout of a substrate including a soft encapsulant deposited in alignment with a first-orientation scribe line for singulating devices mounted on a substrate in accordance with example embodiments.

FIG. 4 is a top view of a layout of a substrate including a soft encapsulant deposited in alignment with a first-orientation scribe line for singulating devices mounted on a substrate in accordance with example embodiments. The soft encapsulant is deposited as an encapsulant barrier 404. In contrast to the cured encapsulants 108 and 208 (which are brittle), the soft encapsulant for forming the encapsulant barrier 404 is characterized by plastic deformation (e.g., rather than breaking) when encountering a mechanical stress (e.g., such as stresses encountered when singulating). Further, the soft encapsulant for forming the encapsulant barrier 404 can be selected to prevent outgassing of potential contaminants while being lased. Accordingly, the soft encapsulant for forming the encapsulant barrier 404 reduces the amount of potential contaminants generated during singulation.

The encapsulant barrier 404 is deposited in alignment with a first-orientation scribe line deposition. For example, the encapsulant barrier 404 is deposited over the first-orientation scribe line, such that the deposited line of the encapsulant barrier 404 covers the scribe line and at least partially fills one (or two) set-back area(s) 340 between the first-orientation scribe line and the distal ends of bond pads of a set of bond pads 360.

The encapsulant barrier 404 is a soft encapsulant (such as a silicone-based epoxy) and can be deposited at standard temperatures using a dispensing nozzle or needle. The silicone-based epoxy can be cured in response to heat, UV radiation and chemical catalysts. After the encapsulant barrier 404 is cured, the encapsulant barrier 404 can be partially removed, such as by exposing the underlying scribe line by lasing in alignment with the first-orientation scribe line. The substrate 302 can be singulated into singulated device assemblies by sawing the substrate along the laser-exposed scribe lines in the first orientation, and by sawing the substrate 302 along the second-orientation scribe lines.

Figure 5:
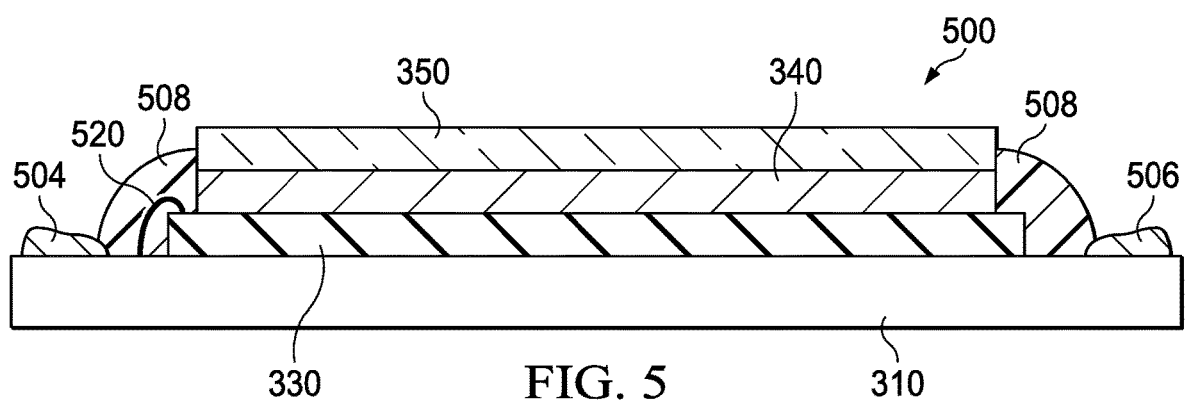
FIG. 5 is a section view of a singulated device assembly including a first-orientation encapsulant barrier in accordance with example embodiments.

FIG. 5 is a section view of a singulated device assembly including a first-orientation encapsulant barrier in accordance with example embodiments. The singulated device assembly 500 includes a singulated device, such as formed by singulating devices along encapsulant barriers 404 as described with respect to FIG. 4.

The singulated device assembly 500 includes a singulated substrate 310 upon which a device 330 is mounted. Electrical terminals (not shown) of the device 330 are coupled to electrical terminals (e.g. bond pads, not shown) of the singulated substrate 310 by bonding wires 520. The bonding wires 520 are encapsulated with an encapsulant 508, such as the brittle encapsulant 108. The encapsulant 508 can be deposited before or after singulation (although efficiencies of batch processing are achieved when the encapsulant 508 is deposited before singulation).

Before curing, the flow in deposition of an inner side of the uncured encapsulant 508 is limited by side edges of the device 330, the spacer 340 and the window 350. During deposition of an outer side encapsulant 508, the flow is limited by an encapsulant barrier, such as 504 (lased) and 506 (unlased). As described hereinbelow with respect to FIG. 8, the flow during deposition of one (or optionally both) end(s) of a deposited line of the encapsulant 808 can be limited (e.g., dammed) by abutting the first and second first-orientation encapsulant barriers 504 and 506.

As described herein, the need for a bonding finger well (for impeding an outward flow of a viscous encapsulant) is obviated, because the encapsulant barriers 504 and 506 are arranged to impede-by-contact (e.g., dam) the outward flow of the encapsulant 508 during deposition. Accordingly, the depth of the substrate (which would otherwise have to be deeper to accommodate the finger bond well) can be reduced, which can reduce cost and size of the singulated device assembly 500.

Also, costs can be reduced by increasing yields of the singulated device assembly 500. For example, the encapsulant barrier 404 can block the flow of the encapsulant 508, such that the encapsulant 508 does not bridge a scribe line (e.g., which would create additional potential contaminants if the encapsulant 508 were sawn). Likewise, yields can be increased by eliminating the finger bond well, because deposition of the encapsulant 508 will not cause overflowing of the eliminated bond finger well.

The efficiency of a light-reflecting singulated device assembly 500 can be increased by reducing the amount of light released through the edges of the component stack of the device 330, the spacer 340 and the window 350. For example, if light is released other than by the top surface of the window 350, then it can increase "ambient" light, which reduces the apparent contrast ratio of an image projected via the top surface of the window 350. Accordingly, the encapsulant barrier can be arranged around one, two, three or four edges of a rectangular singulated device assembly 500, such that light escaping from some or all peripheral edges of the singulated device assembly 500 can be blocked by the encapsulant barrier 404 and/or encapsulant 508 (described hereinbelow with respect to FIG. 7).

Figure 6:
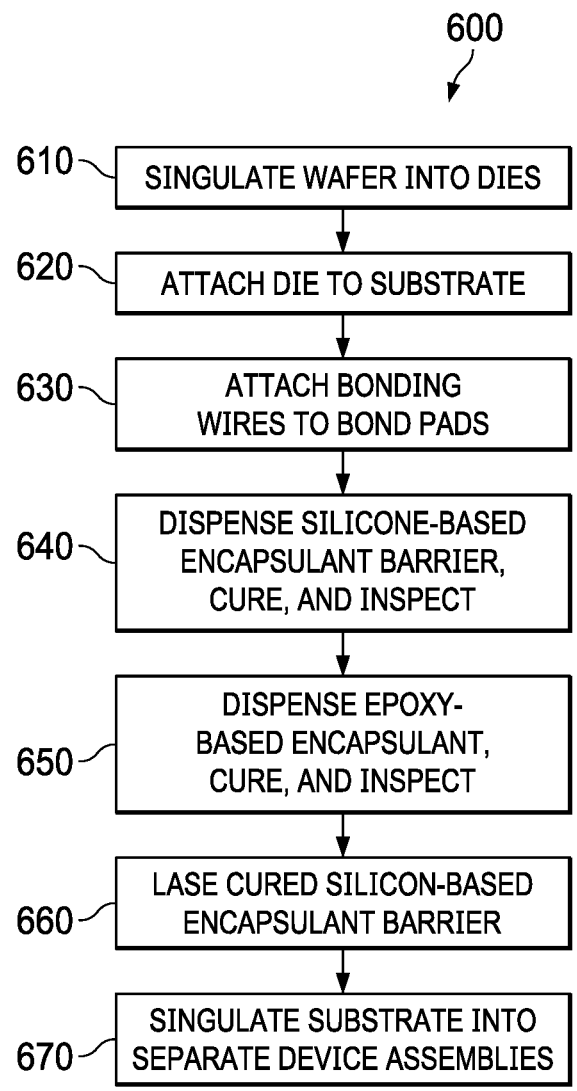
FIG. 6 is a flow diagram of a process for manufacturing devices that include an encapsulant barrier in accordance with example embodiments.

FIG. 6 is a flow diagram of a process for manufacturing devices that include an encapsulant barrier in accordance with example embodiments. Certain operations of flow 600 can be performed in an order other than the enumerated order. For example, operation 660 can be performed before operation 650.

The flow 600 begins at operation 610, which singulates a wafer into dies. For example, a device is manufactured in replicate on a wafer, where each device is separated by a saw lane or a scribe line for singulating the wafer into dies (e.g., such that each die includes a device). The wafer is usually a semiconductor substrate, which can be singulated by sawing along a saw lane or by snapping apart the substrate along a scribe line (e.g., a scored line). The flow 600 continues to operation 620.

At operation 620, a substrate assembly is formed by attaching one or more dies to a substrate. For example, a ceramic or fiberglass substrate is arranged to receive the singulated dies for mounting in rows and columns. The substrate can include chip carriers to which the singulated dies are mounted, such that the mounted, singulated dies can be batch processed. The flow 600 continues to operation 630.

At operation 630, bonding wires are attached to bond pads of a substrate. For example, electrical terminals of a singulated die (located above the substrate) can be electrically coupled to a chip carrier under the substrate via the bonding wires. Accordingly, signals and power of a chip can be routed to terminals, pins, leads, pads and conductive structures that are generally located on a lower portion of the substrate. The flow 600 continues to operation 640.

At operation 640, an encapsulant barrier is dispensed on the substrate, cured and inspected. For example, an encapsulant barrier is dispensed over a first-orientation scribe line, which is arranged between a first device and a second device. As described herein, the encapsulant barrier is cured to form a barrier for limiting the flow of a dispensed encapsulant (e.g., epoxy), such as an encapsulant that is dispensed to encapsulate bonding wires for thermal and mechanical protection. By limiting the flow, set-back margins may be reduced, and yields may be increased, by keeping the encapsulant away from areas (such as areas that are used for singulation). Optional encapsulant barriers can be dispensed over second-orientation scribe lines, which are orthogonal to the first-orientation scribe lines.

The encapsulant barrier can be a silicone-based material, such that the encapsulant barrier is soft, malleable, pliable, flexible and easily removed. The silicone compounds (in contrast to epoxy compounds) are softer and have a lower tensile modulus, a greater elasticity, and a lower adhesion. The cured encapsulant barrier is inspected to help ensure suitability for limiting flows of a dispensed encapsulant. The flow 600 continues to operation 650.

At operation 650, an encapsulant is dispensed on the substrate, cured and inspected. For example, an encapsulant is dispensed to encapsulate one or more of the terminals of a set of bond pads. The encapsulant is deposited between an encapsulant barrier and an edge of the device parallel to the first encapsulant barrier. Before curing, the flow of the encapsulant is limited by the encapsulant barrier and the edge of the device, so the dispensed encapsulant occupies a smaller area.

The encapsulant can be an epoxy compound, such that the encapsulant is hardened by a curing process that includes one or more of UV irradiation, baking and chemical catalysts and reactions. The cured encapsulant is usually hard and brittle. The cured encapsulant barrier is inspected to help ensure the encapsulant is confined to the area between an encapsulant barrier and an edge of the device, so no contamination exists, such as on the surface of an optical window or in a saw-lane/scribe-line. The flow 600 continues to operation 660.

At operation 660, a portion of the cured encapsulant barrier is optionally removed. For example, the cured encapsulant barrier is silicon-based and can be lased to expose an underlying first-orientation scribe line before the substrate is singulated along the first-orientation scribe line. The cured encapsulant barrier can also be optionally removed by one of peeling, chemical removal, lasing, scoring, scraping and abrading. The flow 600 continues to operation 670.

At operation 670, the substrate assembly is singulated into separate device assemblies. For example, the substrate can be singulated by severing the substrate along first-orientation scribe lines, and along second-orientation scribes orthogonal to the first-orientation. Also, for example, the substrate can be severed by sawing, by snapping apart (e.g., by flexing the substrate such that a fracture occurs along a selected scribe line), by lasing, by etching and by jetting (e.g., water jetting with an abrasive slurry). The separate device assemblies can be used as components of larger assemblies, such as cellphones and DLP® optical projectors.

Figure 7:
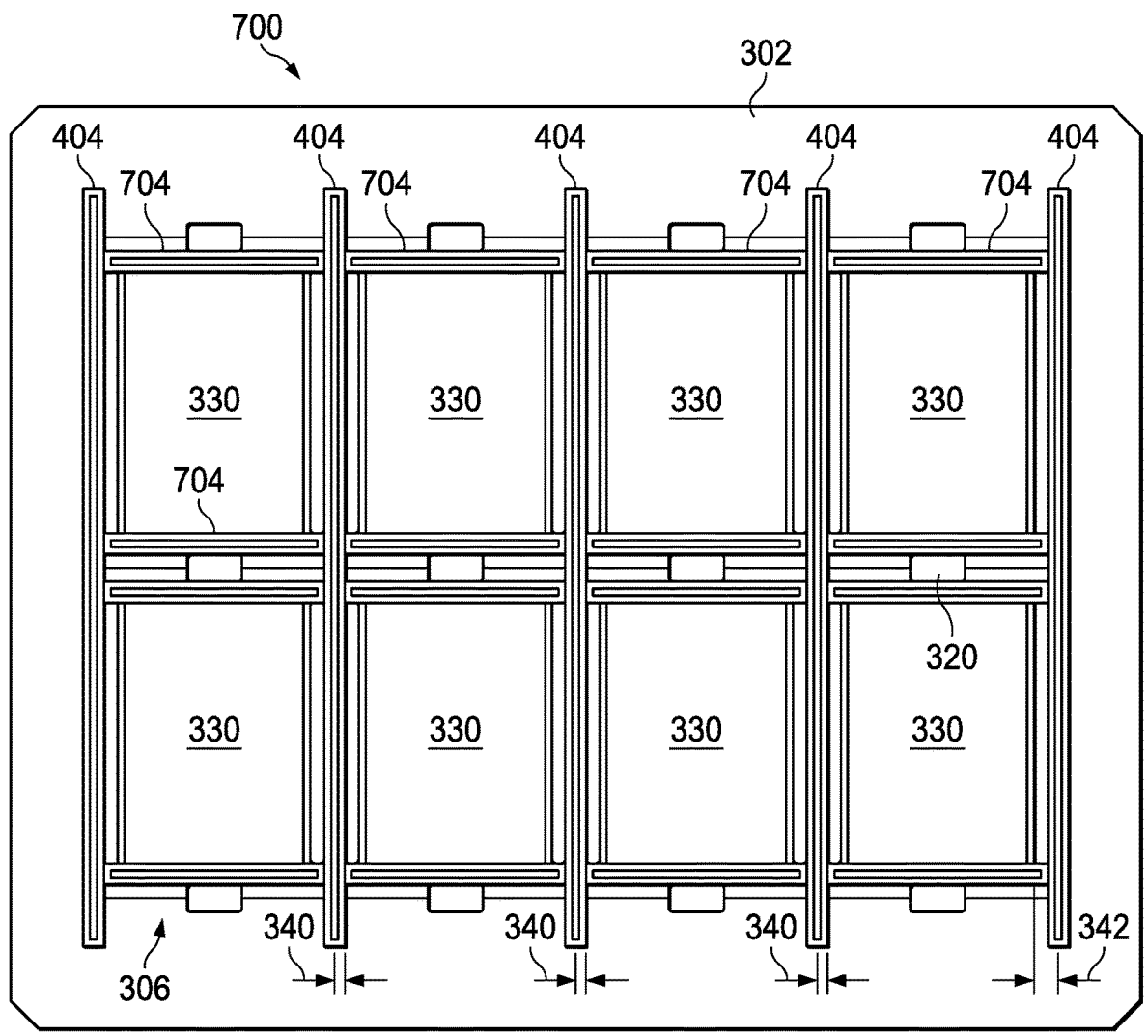
FIG. 7 is a top view of a layout of a substrate that includes a soft encapsulant deposited in alignment with first-orientation and second-orientation scribe lines for singulating devices mounted on a substrate in accordance with example embodiments.

FIG. 7 is a top view of a layout of a substrate that includes a soft encapsulant deposited in alignment with first-orientation and second-orientation scribe lines for singulating devices mounted on a substrate in accordance with example embodiments. The soft encapsulant is characterized by plastic deformation and is deposited as an encapsulant barrier 404, such as along a first-orientation scribe line. For example, the encapsulant barrier 404 is deposited over the first-orientation scribe line, such that the deposited line of the encapsulant barrier 404 covers the scribe line and at least partially fills one (or two) set-back area(s) 340 between the first-orientation scribe line and the distal ends of bond pads of a set of bond pads 360.

The soft encapsulant is also deposited along (e.g., adjacent and parallel to) a second-orientation line, such that the deposited line of the encapsulant barrier 704 rises to an elevation sufficient to occlude a side portion of a window 350. For example, the encapsulant barrier 704 functions as an optical barrier to block light from escaping side edges of the window 350. The encapsulant barrier 704 is deposited between an edge of the device 330, the spacer 340 and a portion of the edge of the window 350 and is deposited between the through-hole 320 and/or a second-orientation scribe line.

Figure 8:
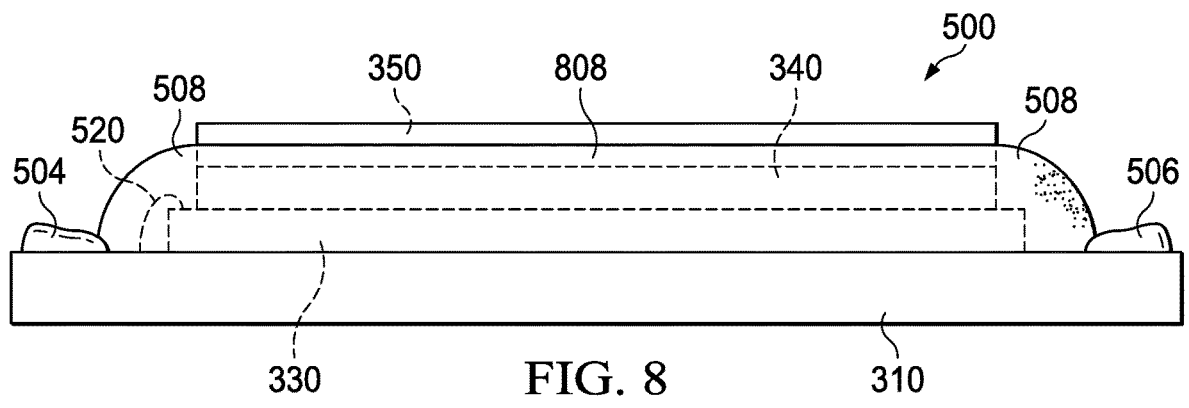
FIG. 8 is a section view of a singulated device assembly that includes first-orientation and second-orientation encapsulant barriers in accordance with example embodiments.

FIG. 8 is a section view of a singulated device assembly that includes first-orientation and second-orientation encapsulant barriers in accordance with example embodiments. The singulated device assembly 800 includes a singulated device, such as formed by singulating devices along encapsulant barriers 404 as described hereinabove with respect to FIG. 4 and FIG. 5. The bonding wires 520 are encapsulated with an encapsulant 508. Encapsulant 808 is contiguous with encapsulant 508 and can be deposited after deposition of the encapsulant 508 by changing the direction of a dispensing nozzle or needle in alignment with a second-orientation line of deposition to deposit the encapsulant 808. A subsequent encapsulant 508 can then be deposited by changing the direction of a dispensing nozzle in alignment with a first-orientation line of deposition.

Before curing, the flow in deposition (of an inner side of the encapsulants 508 and 808) is limited by side edges of the device 330, the spacer 340 and the window 350. During deposition, the flow of an outer side encapsulants 508 and 808 is limited by an encapsulant barrier, such as 504 (lased) and 506 (unlased).

Accordingly, during deposition, the flow (of one or optionally both end(s) of a deposited line of the encapsulant(s) 508 and/or 808) can be limited by the arrangement of an encapsulant barrier 404 and/or 704. For example, the flow of a first end (e.g., starting end) of encapsulant 508 can be limited when the encapsulant 508 is deposited orthogonally to a first encapsulant barrier 404 (e.g., deposited over a first-orientation scribe line). The flow of a second end (e.g., finishing end) of encapsulant 508 can be limited when the encapsulant 808 is deposited orthogonally to (and ending with) a second encapsulant barrier 404. Accordingly, the encapsulant 808 can be deposited along a direction orthogonal to the orientation of the first and second encapsulant barriers. Further, the encapsulant can abut (e.g., have a boundary based on) the first encapsulant barrier 404 and the second encapsulant barrier 404.

Modifications are possible in the described embodiments, and other embodiments are possible, within the scope of the claims.

What is claimed is:

1. A circuit comprising:
   a device;
   a substrate, wherein the device is mounted on the substrate;
   one or more terminals formed on the substrate for attaching lead wires for electrically coupling to the device;
   an encapsulant barrier deposited along a scribe line, wherein the substrate is singulatable along the scribe line; and
   an encapsulant deposited to encapsulate at least one of the one or more terminals, wherein the encapsulant is deposited between the encapsulant barrier and an edge of the device parallel to the encapsulant barrier.

2. The circuit of claim 1, wherein the encapsulant barrier is a first encapsulant barrier, the encapsulant is a first encapsulant, the scribe line is a first scribe line, the edge is a first edge, and the circuit further comprises:
   a second encapsulant barrier deposited along a second scribe line, wherein the substrate is singulatable along the second scribe line, and wherein the second scribe line is parallel to the first scribe line; and
   a second encapsulant deposited to encapsulate at least one of the one or more terminals, wherein the second encapsulant is deposited between the second encapsulant barrier and a second edge of the device parallel to the second encapsulant barrier.

3. The circuit of claim 2, wherein the device is a microelectromechanical system (MEMS) device.

4. The circuit of claim 2, wherein the device is an optical device including an edge of an optical device substrate, an edge of a spacer, and an edge of a window.

5. The circuit of claim 4, wherein at least one of the first encapsulant and the second encapsulant reaches an elevation for blocking light against escaping from the edge of the optical device substrate, the edge of the spacer, and a portion of the edge of the window.

6. The circuit of claim 2, wherein the first encapsulant barrier is a curable encapsulant characterized by plastic deformation, and wherein the second encapsulant barrier is a curable encapsulant characterized by brittleness.

7. The circuit of claim 2, wherein the first and second scribe lines are first and second first-orientation scribe lines, and the circuit further comprises: a third encapsulant barrier deposited along a second-orientation scribe line, wherein the substrate is singulatable along the second-orientation scribe line, and wherein the second-orientation scribe line is orthogonal to the first and second first-orientation scribe lines.

8. The circuit of claim 2, wherein the first and second scribe lines are first and second first-orientation scribe lines, and the circuit further comprises: a third encapsulant deposited adjacent to a second-orientation scribe line, wherein the substrate is singulatable along the second-orientation scribe line, wherein the second-orientation scribe line is orthogonal to the first and second first-orientation scribe lines, wherein a first end of the third encapsulant abuts the first encapsulant barrier, and wherein a second end of the third encapsulant abuts the second encapsulant barrier.

9. The circuit of claim 1, wherein the encapsulant is a curable material for supporting lead wires coupled to the one or more terminals.

10. The circuit of claim 1, wherein the encapsulant barrier is lased to expose the underlying scribe line.

11. A substrate assembly; comprising:
    first and second devices;
    a substrate, wherein the first and second devices are mounted on the substrate, and wherein a scribe line is arranged between the first and second devices;
    an encapsulant barrier deposited along the scribe line, wherein the substrate is singulatable along the scribe line;
    a first set of one or more terminals formed on the substrate between the first device and the scribe line, each terminal of the first set of one or more terminals for attaching a respective lead wire for electrically coupling to the first device;
    a second set of one or more terminals formed on the substrate between the second device and the scribe line, each terminal of the second set of one or more terminals for attaching a respective lead wire for electrically coupling to the second device;
    a first encapsulant deposited to encapsulate one or more terminals of the first set of one or more terminals, wherein the first encapsulant is deposited between the encapsulant barrier and an edge of the first device parallel to the encapsulant barrier; and
    a second encapsulant deposited to encapsulate one or more terminals of the second set of one or more terminals, wherein the second encapsulant is deposited between the encapsulant barrier and an edge of the second device parallel to the encapsulant barrier.

12. The substrate assembly of claim 11, wherein the scribe line is a first scribe line, the encapsulant barrier is a first encapsulant barrier, the edge of the first device is a first edge of the first device, and the substrate assembly further comprises:
    a second encapsulant barrier deposited along a second scribe line adjacent to the first device, wherein the substrate is singulatable along the second scribe line, and wherein the second scribe line is parallel to the first scribe line; and
    a third encapsulant deposited to encapsulate one or more terminals of a third set of one or more terminals, each terminal of the third set of one or more terminals for attaching a respective lead wire for electrically coupling to the first device, wherein the third encapsulant is deposited between the second encapsulant barrier and a second edge of the first device parallel to the first encapsulant barrier.

13. The substrate assembly of claim 12, wherein the first and second scribe lines are first and second first-orientation scribe lines, and the substrate assembly further comprises: a third encapsulant barrier deposited along a second-orientation scribe line adjacent to the first and second devices, wherein the substrate is singulatable along the second-orientation scribe line, and wherein the second-orientation scribe line is orthogonal to the first and second first-orientation scribe lines.

14. The substrate assembly of claim 12, wherein the first and second scribe lines are first and second first-orientation scribe lines, and the substrate assembly further comprises: a third encapsulant deposited adjacent to a second-orientation scribe line, wherein the substrate is singulatable along the second-orientation scribe line, wherein the second-orientation scribe line is orthogonal to the first and second first-orientation scribe lines, wherein a first end of the third encapsulant abuts the first encapsulant barrier, and wherein a second end of the third encapsulant abuts the second encapsulant barrier.

15. A method, comprising:
   mounting a device on a substrate adjacent to a scribe line, wherein the scribe line is arranged for singulating the device;
   depositing an encapsulant barrier along the scribe line;
   forming a set of one or more terminals on the substrate between the device and the scribe line, wherein each terminal of the set of one or more terminals is for electrically coupling attaching a respective lead wire to the device; and
   depositing an encapsulant to encapsulate one or more terminals of the set of one or more terminals, wherein the encapsulant is deposited between the encapsulant barrier and an edge of the device parallel to the encapsulant barrier.

16. The method of claim 15, wherein the device is a first device, the set of one or more terminals is a first set of one or more terminals, the encapsulant is a first encapsulant, and the method further comprises:
   mounting a second device on the substrate adjacent to the scribe line, wherein the scribe line is arranged for singulating the second device;
   forming a second set of one or more terminals on the substrate between the second device and the scribe line, wherein each terminal of the second set of one or more terminals is for electrically coupling attaching a respective lead wire to the second device; and
   a second encapsulant deposited to encapsulate one or more terminals of the second set of one or more terminals, wherein the second encapsulant is deposited between the first encapsulant barrier and an edge of the second device parallel to the first encapsulant barrier.

17. The method of claim 16, wherein the scribe line is a first scribe line, the encapsulant barrier is a first encapsulant barrier, and the method further comprises:
   depositing a second encapsulant barrier along a second scribe line adjacent to the first device, wherein the substrate is singulatable along the second scribe line, and wherein the first and second scribe lines are first and second first-orientation scribe lines;
   depositing a third encapsulant barrier along a second-orientation scribe line adjacent to the first and second devices, wherein the substrate is singulatable along the second-orientation scribe line, and wherein the second-orientation scribe line is orthogonal to the first and second first-orientation scribe lines.

18. The method of claim 15, wherein the scribe line is a first scribe line, the encapsulant barrier is a first encapsulant barrier, and the method further comprises:
   depositing a second encapsulant barrier along a second scribe line adjacent to the device, wherein the substrate is singulatable along the second scribe line, and wherein the first and second scribe lines are first and second first-orientation scribe lines;
   depositing a third encapsulant adjacent to a second-orientation scribe line, wherein the substrate is singulatable along the second-orientation scribe line, wherein the second-orientation scribe line is orthogonal to the first and second first-orientation scribe lines, wherein a first end of the third encapsulant abuts the first encapsulant barrier, and wherein a second end of the third encapsulant abuts the second encapsulant barrier.

19. The method of claim 15, further comprising: removing a portion of the first encapsulant barrier by one of peeling, chemical removal, lasing, scoring, scraping, and abrading.

20. The method of claim 19, further comprising: singulating the substrate by one of sawing, lasing, scoring then snapping apart, etching, and water jetting.

* * * * *